(12) United States Patent
Gratrix et al.

(10) Patent No.: US 10,679,884 B2
(45) Date of Patent: Jun. 9, 2020

(54) FILM ELECTRODE FOR ELECTROSTATIC CHUCK

(71) Applicant: M Cubed Technologies, Inc., Newtown, CT (US)

(72) Inventors: Edward Gratrix, Monroe, CT (US); Prashant Karandikar, Avondale, PA (US); David Casale, Philadelphia, PA (US); Michael Aghajanian, Newark, DE (US); Derek Rollins, Philadelphia, PA (US)

(*) Notice: Subject to any disclaimer, the term of this patent is extended or adjusted under 35 U.S.C. 154(b) by 328 days.

(21) Appl. No.: 15/683,747

(22) Filed: Aug. 22, 2017

(65) Prior Publication Data

US 2018/0047605 A1 Feb. 15, 2018

Related U.S. Application Data

(63) Continuation of application No. PCT/IB2016/000499, filed on Feb. 23, 2016.

(60) Provisional application No. 62/119,773, filed on Feb. 23, 2015.

(51) Int. Cl.
| | |
|---|---|
| *H01T 23/00* | (2006.01) |
| *H01L 21/683* | (2006.01) |
| *H01L 21/687* | (2006.01) |
| *C23C 14/14* | (2006.01) |
| *C23C 16/06* | (2006.01) |

(52) U.S. Cl.
CPC ......... *H01L 21/6833* (2013.01); *C23C 14/14* (2013.01); *C23C 16/06* (2013.01); *H01L 21/6831* (2013.01); *H01L 21/6875* (2013.01)

(58) Field of Classification Search
None
See application file for complete search history.

(56) References Cited

U.S. PATENT DOCUMENTS

| | | | |
|---|---|---|---|
| 4,502,094 | A | 2/1985 | Lewin et al. |
| 4,551,192 | A | 11/1985 | Di Milia et al. |
| 5,103,367 | A | 4/1992 | Horwitz et al. |

(Continued)

FOREIGN PATENT DOCUMENTS

| | | |
|---|---|---|
| KR | 100 900 496 | 6/2009 |
| WO | WO 2009/36995 | 3/2009 |
| WO | WO 2012/005294 | 1/2012 |

OTHER PUBLICATIONS

International Search Report dated Aug. 4, 2016 for International Application No. PCT/IB2016/000499.

*Primary Examiner* — Stephen W Jackson
(74) *Attorney, Agent, or Firm* — Ramberg IP, LLC

(57) ABSTRACT

A perforated film electrode for a pinned electrostatic chuck that lies below the top surface of the pins in the valleys or interstices between pins, below the elevation of the top surface of the pins, and is attached to the body of the chuck. In one embodiment, the perforated film electrode assembly features a thin film electrode sandwiched between thin sheets of electrically insulating material. The top, outer or exposed surface of the perforated film electrode assembly has a flatness that is maintained within 3 microns. That is, the distance or elevation between the tops of the pins and the top surface of the perforated film unit is maintained within plus or minus 3 microns. A tool for producing a uniform elevation of the top and bottom sheets or layers of electrically insulating material also is taught.

18 Claims, 10 Drawing Sheets

(56) References Cited

U.S. PATENT DOCUMENTS

| | | | |
|---|---|---|---|
| 5,160,152 A | 11/1992 | Toraguchi et al. | |
| 5,166,856 A | 11/1992 | Liporace et al. | |
| 5,413,360 A | 5/1995 | Atari et al. | |
| 5,452,177 A | 9/1995 | Frutiger | |
| 5,548,470 A | 8/1996 | Husain et al. | |
| 5,675,471 A | 10/1997 | Kotecki | |
| 5,691,876 A | 11/1997 | Chen et al. | |
| 5,761,023 A | 6/1998 | Lue et al. | |
| 5,812,362 A | 9/1998 | Ravi | |
| 5,916,689 A | 6/1999 | Collins et al. | |
| 5,969,934 A | 10/1999 | Larsen | |
| 6,606,234 B1 | 8/2003 | Divakar | |
| 6,628,500 B1 | 9/2003 | Thomas et al. | |
| 6,628,503 B2 | 9/2003 | Sogard | |
| 6,643,115 B2 | 11/2003 | Sakaue et al. | |
| 6,710,307 B2 * | 3/2004 | Ito | H01L 21/67103 118/725 |
| D490,093 S | 5/2004 | Okugawa | |
| D490,094 S | 5/2004 | Okugawa | |
| D490,095 S | 5/2004 | Okugawa | |
| D491,206 S | 6/2004 | Okugawa | |
| D497,171 S | 10/2004 | Okugawa | |
| 6,815,646 B2 * | 11/2004 | Ito | H01L 21/67103 219/444.1 |
| 6,922,324 B1 | 7/2005 | Horwitz | |
| 7,430,104 B2 | 9/2008 | Litman et al. | |
| 7,511,935 B2 | 3/2009 | Nakash | |
| 2005/0266587 A1 | 12/2005 | Nimmakayala | |
| 2012/0207931 A1 | 8/2012 | Ota | |

\* cited by examiner

FILM ELECTRODE FOR ELECTROSTATIC CHUCK

CROSS-REFERENCE TO RELATED APPLICATION(S)

This patent document is a Continuation of International patent application No. PCT/IB2016/000499, entitled "FILM ELECTRODE FOR ELECTROSTATIC CHUCK", filed on Feb. 23, 2016, which international application claims the benefit of U.S. Provisional Patent Application No. 62/119,773, entitled "Film electrostatic chuck", filed on Feb. 23, 2015, in the name of inventors Edward Gratrix et al. The entire contents of these patent applications are incorporated by reference herein.

STATEMENT REGARDING U.S. FEDERALLY SPONSORED RESEARCH

None.

BACKGROUND OF THE INVENTION

1. Field of the Invention

The present invention relates to electrostatic chucks for supporting and precisely positioning articles such as semiconductor wafers during processing. The present invention also relates to the electrodes used in such electrostatic chucks.

2. Description of Related Art

In semiconductor fabrication, a chuck is a device used to hold a silicon wafer during various semiconductor processing steps:
  Lithography (currently in air, future in vacuum)
  Physical vapor deposition (PVD) (in vacuum)
  Chemical vapor deposition (CVD) (in vacuum)
  Ion implantation (in vacuum)
  Test and Measurement (optical in air/SEM in vacuum)

For processes carried out at ambient pressure vacuum can be used to "suck-down" and hold the wafer on the chuck. Different process steps need different flatness of the wafer and the chuck. Lithography step is the most demanding due to the need for printing finer and finer lines to keep up with the Moore's Law and half pitch (HP) nodes which have evolved as shown in Table 1.

TABLE 1

Evolution of half pitch nodes

| Year | Half Pitch Node (nm) |
|---|---|
| 1997 | 250 |
| 2002 | 128 |
| 2007 | 65 |
| 2013 | 32 |
| 2016 | 22 |
| 2018 | 18 |

As Moore's Law pushes semiconductor feature sizes smaller and smaller, the need for highly precise wafer handling components grows. The difficulty in achieving the required precision also grows. For instance, the silicon wafers upon which are to be manufactured the microprocessor chips must be precisely placed in the processing machines. The wafers typically are handled by vacuum handling equipment. The wafers droop, ever-so-slightly under their own weight. When lowered to a wafer chuck, the drooping wafer "wants" to flatten out, but may be hindered from doing so by friction between the wafer and chuck. This is sometimes referred to as a "stickiness" problem.

Among the efforts to solve, or at least ameliorate, this problem, have been to minimize the contact area between the wafer and the chuck. This particular engineering solution may take the form of designing a plurality of "plateaus" of uniform height, typically regularly spaced, into the wafer. These plateaus are called "pins" or "mesas", the pins defining a very flat support surface upon which a semiconductor wafer may be placed. The pins help in reducing the friction so that the wafer can move laterally across the mesas as it flattens out upon settling on the pins.

A pinned surface also helps to prevent backside contamination, and also reduces the chances of a particle getting between chuck and wafer, which would cause flatness deviation. These can be finished to <10 nm die site flatness to allow production of nanometer scale features by the lithography process. More specifically, this means that over or across the length of a semiconductor die site, for example 28 mm, the flatness may need to be maintained to within 10 nm.

Heat is associated or involved or a by-product of many of the wafer processing steps. The expansion of materials due to the application of heat (thermal expansion) is a potential source of positioning/alignment errors. Thus, wafer handling equipment such as wafer chucks desirably have heat management capability such as internal cooling (e.g., cooling channels), and low coefficient of thermal expansion (CTE).

With this in mind, other key desired features for wafer handling components are high mechanical stability (high stiffness and low density), high thermal conductivity, low metallic contamination, machinability to high tolerance, low wear (to maintain precision), low friction (to prevent wafer sticking), and the ability to be fabricated to sizes of up to 450 mm.

Silicon carbide (SiC) has desirable properties for use as a wafer chuck: low density, low thermal expansion coefficient, and high thermal conductivity, to name three.

Silicon carbide-based bodies can be made to near net shape by reactive infiltration techniques, and such has been done for decades. In general, such a reactive infiltration process entails contacting molten silicon (Si) with a porous mass containing silicon carbide plus carbon in a vacuum or an inert atmosphere environment. A wetting condition is created, with the result that the molten silicon is pulled by capillary action into the mass, where it reacts with the carbon to form additional silicon carbide. This in-situ silicon carbide typically is interconnected. A dense body usually is desired, so the process typically occurs in the presence of excess silicon. The resulting composite body thus contains primarily silicon carbide, but also some unreacted silicon (which also is interconnected), and may be referred to in shorthand notation as Si/SiC. The process used to produce such composite bodies is interchangeably referred to as "reaction forming", "reaction bonding", "reactive infiltration" or "self bonding". In more recent technology, for added flexibility, one or more materials other than SiC can be substituted for some or all of the SiC in the porous mass. For example, replacing some of this SiC with diamond particulate can result in a diamond/SiC composite, for example, one containing 1-60 vol % diamond.

It is critical that wafers lie flat against the support surface(s) of the chuck. Otherwise, the circuit pattern images that are projected onto the wafer may be out-of-focus. Furthermore, wafer lithography may involve multiple exposures, with re-location of the wafer between exposures. Thus, it is critical that there be a way to precisely re-align the wafer on the chuck relative to its first positioning so that the subsequent exposures will take place in the correct position on the wafer.

Wafer Contamination and Wafer Landing

Why are wafers not flat to begin with? When wafers are processed and by inherent limitations of the manufacture they are not flat. Often processes performed in the front-end semiconductor line add films to the wafer, which results in more-or-less curved wafers. This curvature can be any direction, upward or downwards. The majority of the departure from flat is in curvature and deformation is as a sphere and or cylindrical shape.

Additionally, wafer chucks are never perfectly flat, and often have a slight curvature in a random manner and orientations like that of a wafer in upwards (bowl) or downwards (dome) shape.

When wafers that have picked up a curvature due to normal process are located on a wafer chuck, they are required to return to the original clamping location by settling to flat. The wafer is required to relax in a manner that is predominately radial.

For processes carried out at ambient pressure vacuum can be used to "suck-down" and hold the wafer on the chuck.

Reaction bonded SiC (RBSC) or Si/SiC material offers high stiffness, high thermal conductivity, high wear resistance, and a low CTE matching that of Si wafer for chuck applications (see Table 2). In addition, internal cooling channels 13 can be produced (FIG. 1) for precise temperature control.

For processes carried out in vacuum, a vacuum chuck cannot be used to hold the wafer during the processing steps. Therefore, electrostatic attraction is used to hold the wafer down on the chuck. This chuck is called an electrostatic chuck (or "E-chuck"). FIG. 2 shows a schematic of an electrostatic chuck.

thick). Finally, a thin dielectric layer 27 (with high dielectric strength, 100-200 micrometer thickness) is placed on top (e.g. aluminum oxide—$Al_2O_3$, glass, quartz, aluminum nitride—AlN, polymers like polyimide, bisbenzocyclobutene) to electrically isolate the Si wafer 29. A high voltage (~1000 volts) such as ±5 kV is applied to the metallization via electrical feedthroughs. An electrostatic attractive force is generated between the Si wafer and the chuck, holding it down securely on the chuck. A similar approach can be used for other semiconductor wafers (SiC, GaAs) and glass wafers/sheets for liquid crystal display (LCD) lithography. As can be seen, conventional E-chucks are not sophisticated in terms of extreme flatness, minimal wafer side back contact (pinned surface), flow-through cooling, high thermal conductivity of substrates, and low thermal expansion of substrates.

The next generation lithography processes such as extreme ultra violate (EUV) and electron beam, will be performed in vacuum. Thus, E-chucks will have to be used instead of vacuum chucks. All the high-end functionality in a reaction bonded SiC vacuum chucks (nm flatness, high thermal conductivity, low CTE matching with that of Si wafer, pinned surface, flow-through cooling), will have to be brought into the E-chuck design.

A traditional way to achieve this would be to use the multiple layer approach as in FIG. 2 and bond various components. In addition, an expensive ceramic dielectric such as AlN (high thermal conductivity) has to be used. Due to the thinness of the dielectric layer required (100-200 micrometers) and pinned geometry, such stand-alone ceramic layer is extremely expensive and difficult to produce—more so as the wafer sizes are moving to 450 mm from 300 mm.

SUMMARY OF THE INVENTION

In accordance with an aspect of the instant invention, an electrostatic chuck has been designed and engineered wherein the electrode providing the electrostatic force is in the form of a perforated film. This perforated film electrode is for a pinned electrostatic chuck, and is situated or posi-

TABLE 2

Summary of properties of materials for E-chuck construction

| Material | Density (g/cc) | Elastic Modulus (GPa) | Thermal Conductivity (W/mk) | CTE (ppm/K) | Electrical Resistivity (ohm · cm) | Dielectric Constant | Dielectric Strength (kV/mm) |
|---|---|---|---|---|---|---|---|
| Aluminum | 2.7 | 70 | 230 | 23 | $2.7 \times 10^{-6}$ | — | — |
| Si | 2.33 | 120 | 148 | 2.6 | $1 \times 10^{-3}$ (doped) $10^1$ (pure) | 11.7 | 3 |
| Si/SiC | 3.00 | 360 | 170 | 2.9 | $10^{-1}$ | — | — |
| SiC | 3.15 | 430 | 120 | 2.5 | $10^2$-$10^5$ | 9.7 | 10 |
| AlN | 3.26 | 330 | 140-180 | 4.5 | $10^{14}$ | 9 | 17 |
| $Al_2O_3$ | 3.9-3.99 | 370-400 | 36-31 | 6.5 | $10^{14}$ | 10 | 10-18 |
| Sapphire | 3.99 | 400 | 42 | 6.9, 5.9 | $10^{14}$ | 7.5-10.5 | 17 |
| Quartz | 2.2 | 73 | 1.5 | 0.33 | $10^{16}$ | 3.8 | 25-40 |
| Polyimide | 1.42 | 3 | 0.3 | 55 | $10^{16}$ | 3.4 | 22 |
| BCB (Dow) | 1.4 | 2.9 | 0.29 | 42 | $10^{19}$ | 2.65 | 53 |
| CVD Diamond | 3.52 | 1000 | 700-1800 | 1 | $>10^{14}$ | 5.6 | 100 |

A conventional e-chuck typically consists of an assemblage of layers of various materials possessing various properties (FIG. 2). The base layer 21 is typically a high thermal conductivity material such as aluminum. The next layer is an insulator 23 (e.g. aluminum oxide—$Al_2O_3$, glass, quartz) for providing electrical isolation. This is followed by a layer of thin metal electrodes 25 (e.g. Al, Mo, ~1 µm tioned such that it lies in the valleys or interstices between pins, below the elevation of the top surface of the pins, and is attached to the body of the chuck. The perforated film electrode assembly features a thin film electrode sandwiched between thin sheets of electrically insulating material. The top, outer or exposed surface of the perforated film electrode assembly has a flatness that is maintained within 3 microns.

That is, the distance or elevation between the tops of the pins and the top surface of the perforated film unit is maintained within plus or minus 3 microns. A tool for producing a uniform elevation of the top and bottom sheets or layers of electrically insulating material also is taught.

The electrostatic clamping force is proportional to the inverse square of the dielectric thickness and the gap between the dielectric and the wafer being chucked. In a second aspect of the instant invention, Applicant has developed a tool and technique for precisely controlling the gap. The practice involves precisely controlling the thickness of polymer that forms the first layer of the multilayer film, the layer that bonds the metallization layer to the base of the chuck. More specifically, a tool in the form of a silica-containing plate having a very flat top, or reference, surface, is fabricated. Very shallow (several microns deep) depressions are etched into the silica. The depth is controlled by etch rate, and is very uniform across the plurality of depressions, which are also sized (diameter) and positioned to correspond to the pins of the chuck. Polymer resin in an excess amount is placed onto the pinned surface of the chuck. The tool is inverted and placed against the pins, and positioned such that the pins line up with the depressions in the tool. The tool is then pressed into the polymer as far as it will go. After curing the polymer, the tool is removed, leaving cured polymer between pins that has a uniform depth below the tops of the pins.

DETAILED DESCRIPTION OF EMBODIMENTS OF THE INVENTION

Pinned E-Chuck with Sandwich Film for Electrostatic Chucking

Figure 1:
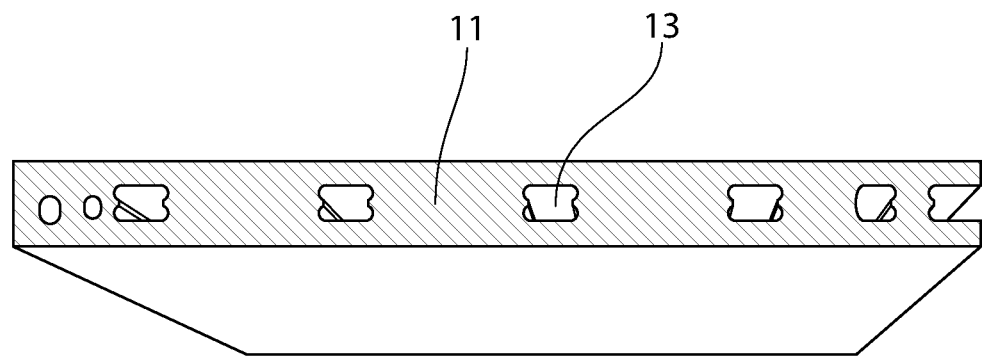
FIG. 1 is a perspective view of a cross-section of a vacuum chuck 11 having flow-through cooling channels 13.
Figure 2:
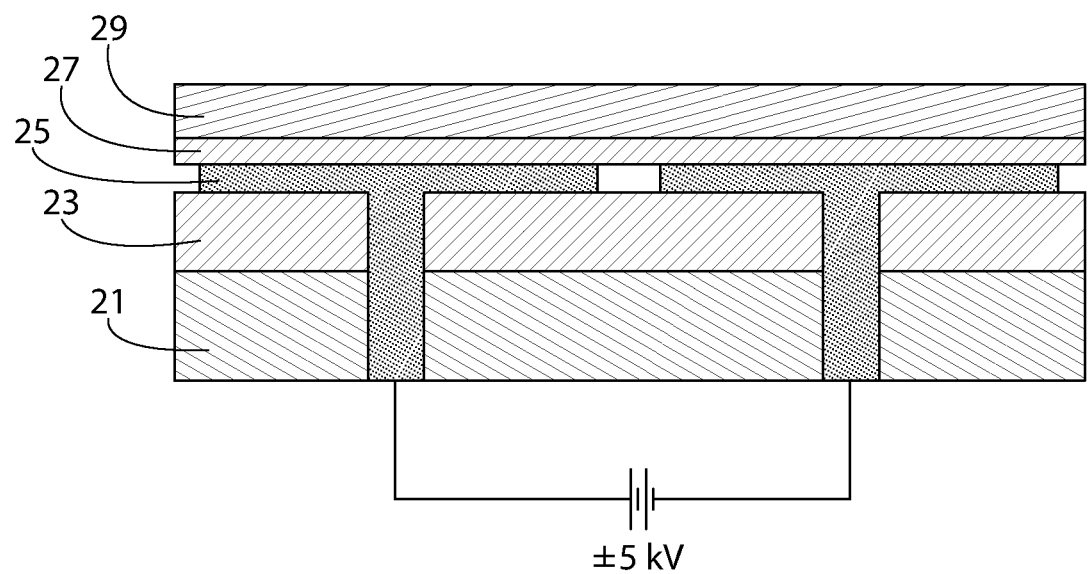
FIG. 2 is a cross-sectional schematic view of a prior art electrostatic chuck.
Figure 3:
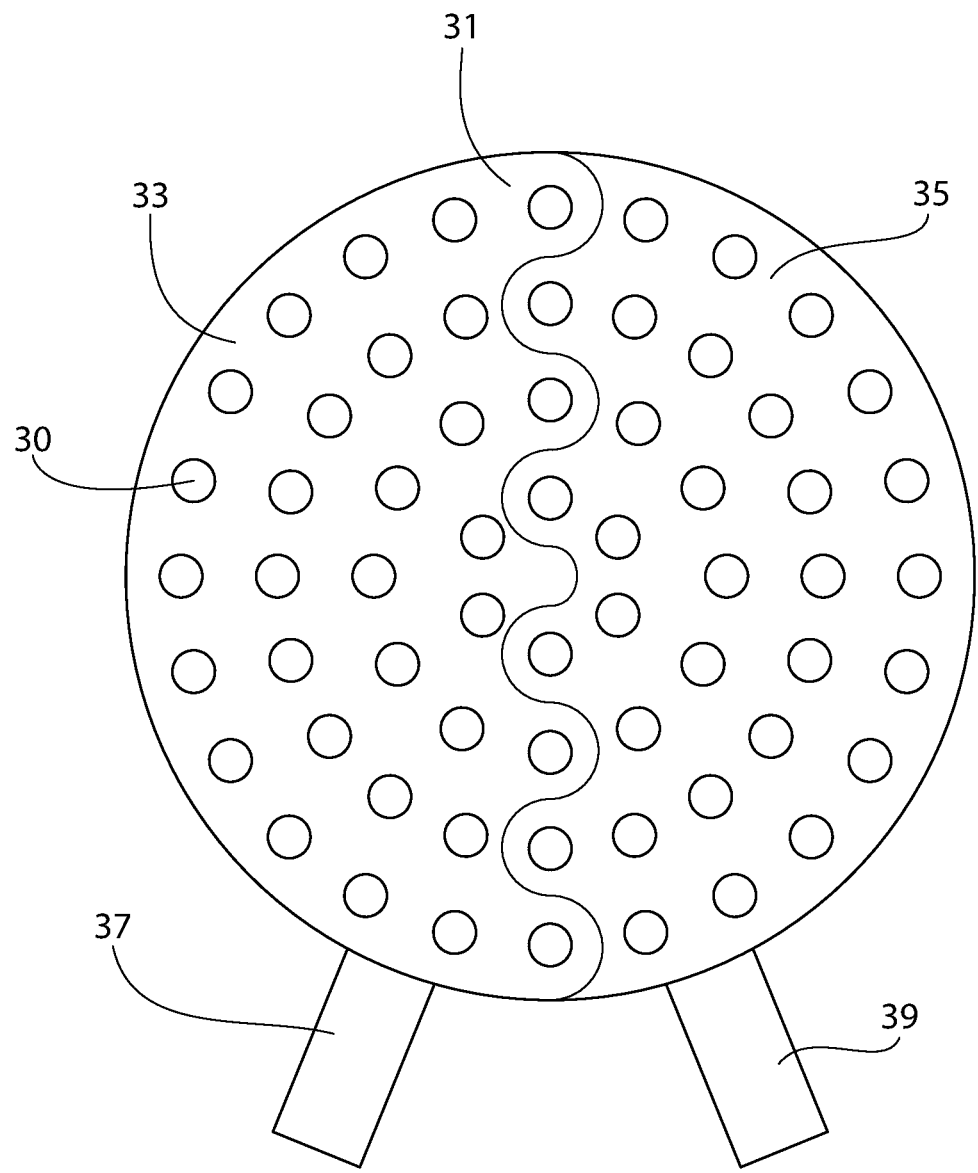
FIG. 3 is a head-on or front view of perforated film electrode for an electrostatic chuck.

The Applicant has developed an innovative approach to build insulator-metallization-dielectric layers on top of the pinned Si/SiC substrate. FIG. 3 shows a schematic of E-chuck built this way. The following Example 1 demonstrates the steps in this innovative approach.

Example 1

Fabrication of E-Chuck Having Perforated Multilayer Electrode

An E-chuck Si/SIC substrate measuring 350 mm in diameter and 6 mm thick is first fabricated. It is produced by a reaction bonding process that is known in the art. The Si/SiC substrate is then ground and machined to high flatness. Next, the pins are produced by machining or eroding the very flat wafer supporting surface in regions that are not pins; that is, regions between pins. The eroding may be performed by electric discharge machining (EDM). The pin diameter is 1000 micrometer and the pin height is 140 micrometer. Pin spacing is 5 mm and pins are in a triangular pattern. The pin-height is selected to accommodate the layer stack to be bonded on subsequently. Then, the pinned substrate is lapped. This pinned substrate provides high flatness (nm scale on die site), high thermal conductivity, flow-through cooling, and a matching CTE with the Si wafer.

Building the Multilayer Film Electrode

Figure 4:
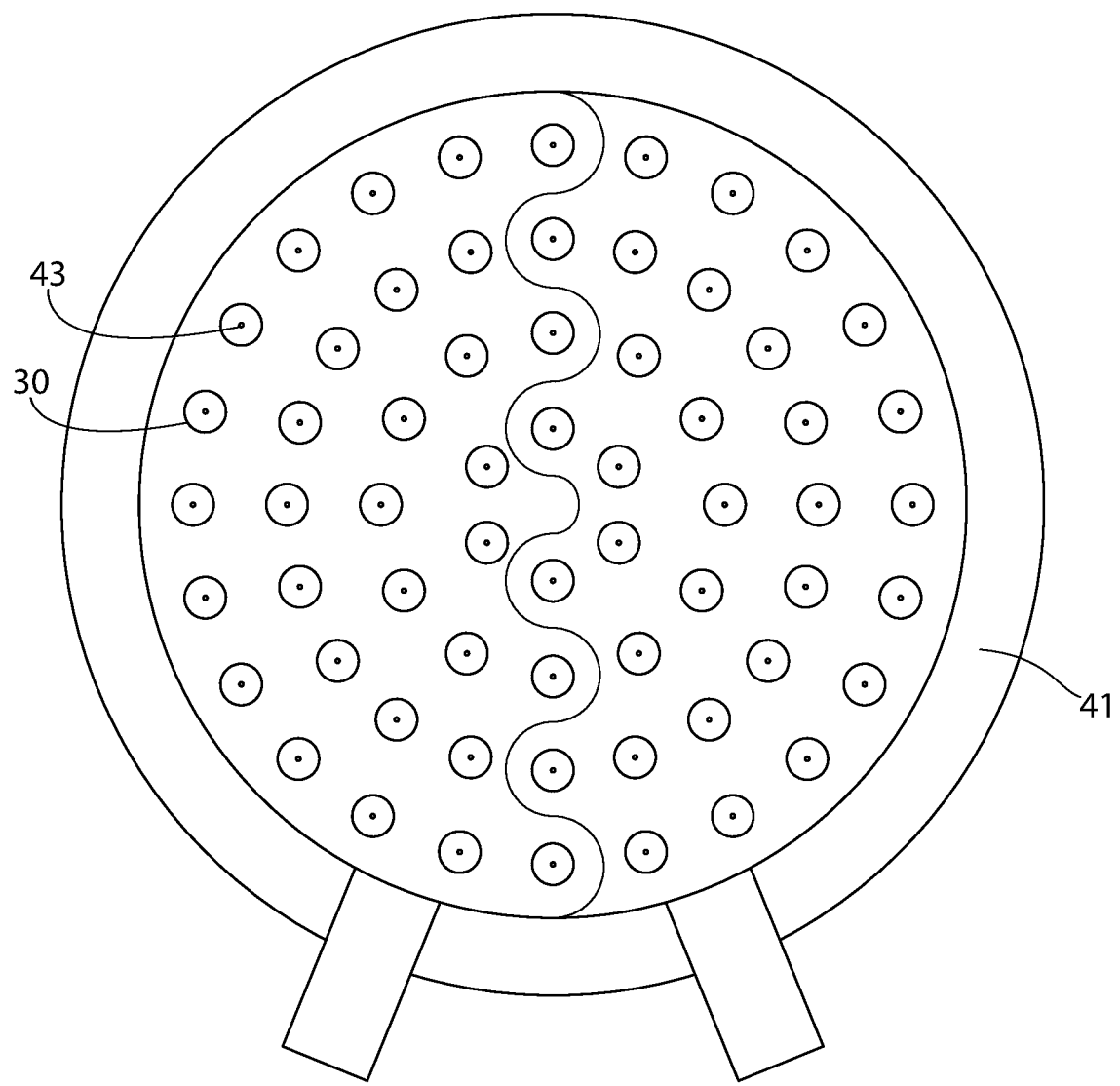
FIG. 4 is a head-on or front view of the perforated film electrode of FIG. 4 attached to a pinned electrostatic chuck substrate and aligned such that the pins correspond to the perforations in the film.

Construction begins by obtaining a commercially available dielectric film 31 (e.g. UPILEX polyimide (UBE Company, Tokyo, Japan), 2 mil thick—(50 µm thick) with metallization 32 (0.3 µm Al). Next, two half circles 33, 35 (325 mm diameter) are cut out of the metallized UPILEX film with each half having a region 37, 39 that could extend beyond the 350 mm Si/SiC substrate for electrical connection. Then, the two semicircular UPILEX metallized film halves are bonded on a 3 mil (75 µm thick) PYRALUX LF (DuPont Company, Wilmington, Del.) film 34 of 335 mm diameter. This film is a B-staged modified acrylic sheet double-sided adhesive. After this step, holes 30 in this film layer stack are machined to accommodate the pins. The machining may take the form of one of a variety of techniques such as laser ablation, lithography. FIG. 3 shows a film stack with perforations produced this way. Lastly, this film is bonded in place on top of the pinned substrate 41. See FIG. 4. Note the pins 43 centered in the holes 30 of the multilayer film electrode 31.

Figure 5:
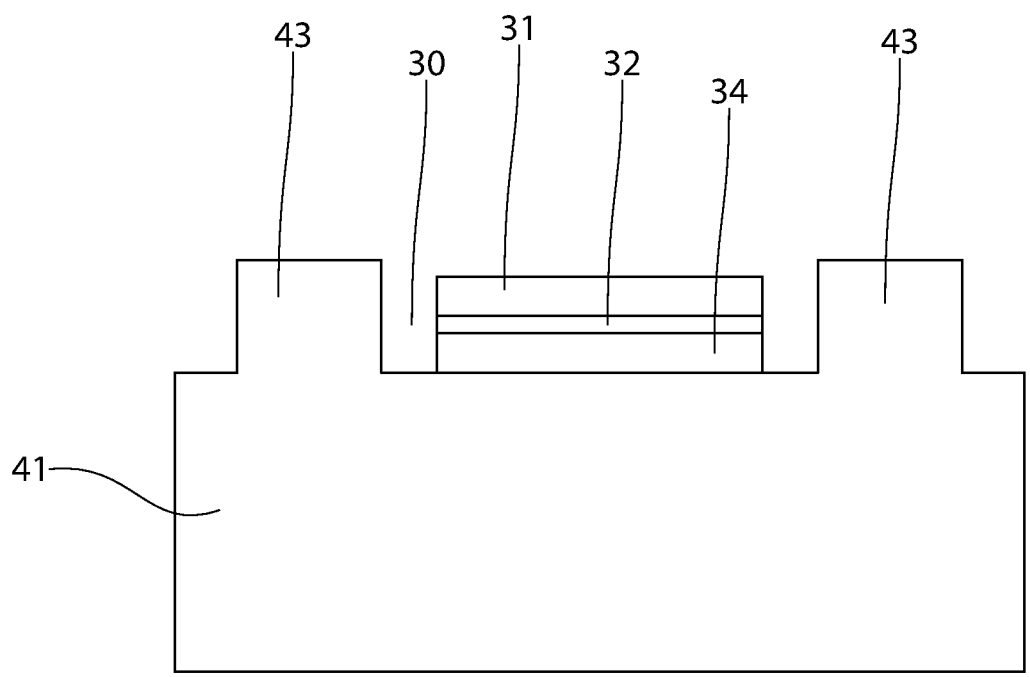
FIG. 5 is a cross-sectional schematic view of the bonded assembly of e-chuck substrate and perforated electrode film.

FIG. 5 is a cross-sectional schematic view of the bonded assembly of e-chuck substrate and perforated electrode film. This drawing is not to scale; however, the pins are about 1000 microns wide, and about 140 microns above the floor, base or valley of the substrate body. The total film height is about 125 microns, with 0.3 micron being the thickness of the metallization (metal layer). There is about a 150 micron gap between each edge of the film and the wall of the pin.

Testing the E-Chuck with Multilayer Film Electrode

Figure 6:
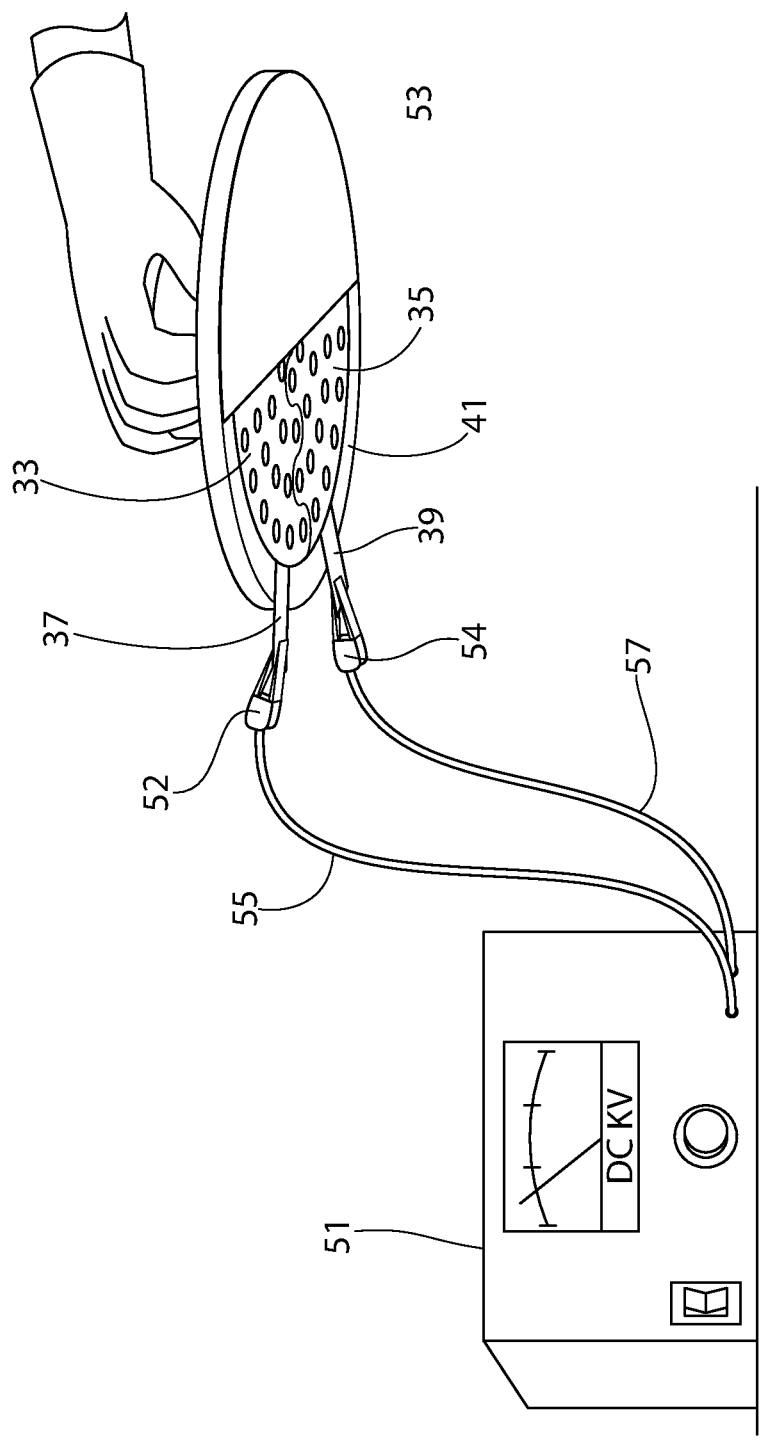
FIG. 6 is a photograph rendered as a drawing, and showing that the prototype e-chuck can hold a silicon wafer upside down under an applied electrostatic voltage of several thousand volts DC.
Figure 7A:
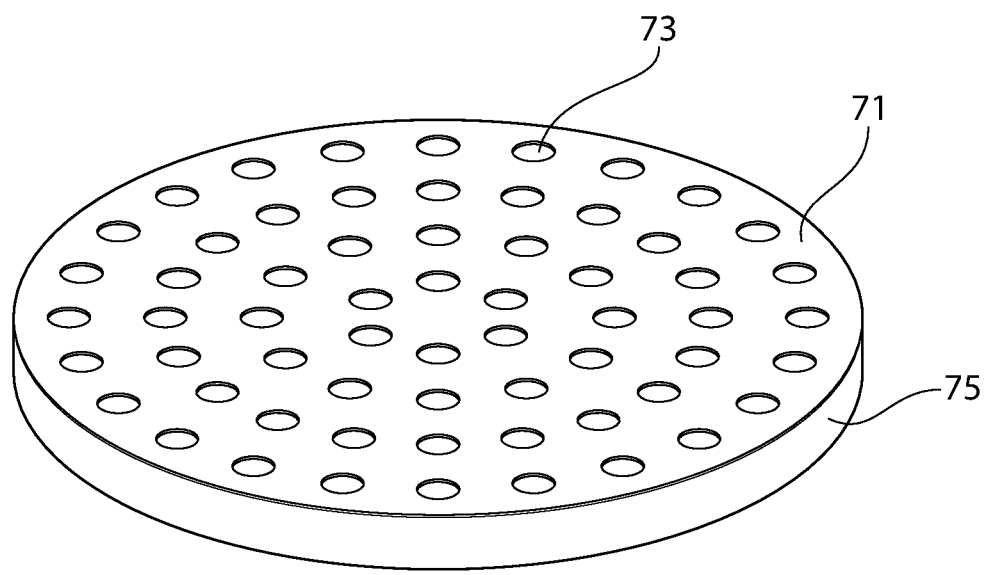
FIGS. 7A and 7B are an isometric and cross-sectional side views, respectively, of a quartz tool coated with chromium, and with holes in the chromium layer corresponding to pin locations on the e-chuck.
Figure 7B:
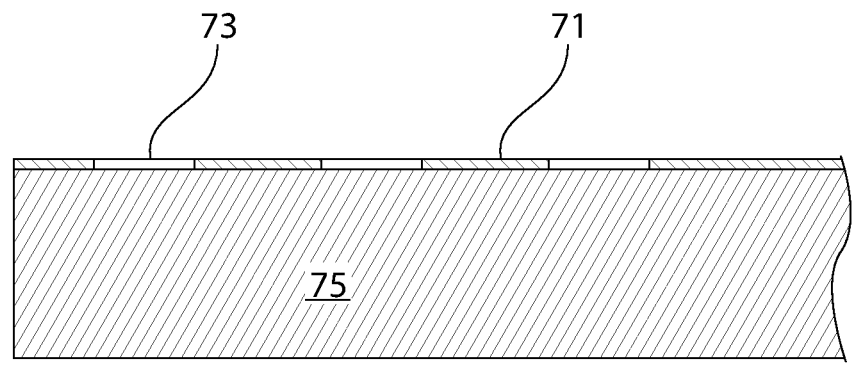
Figure 7C:
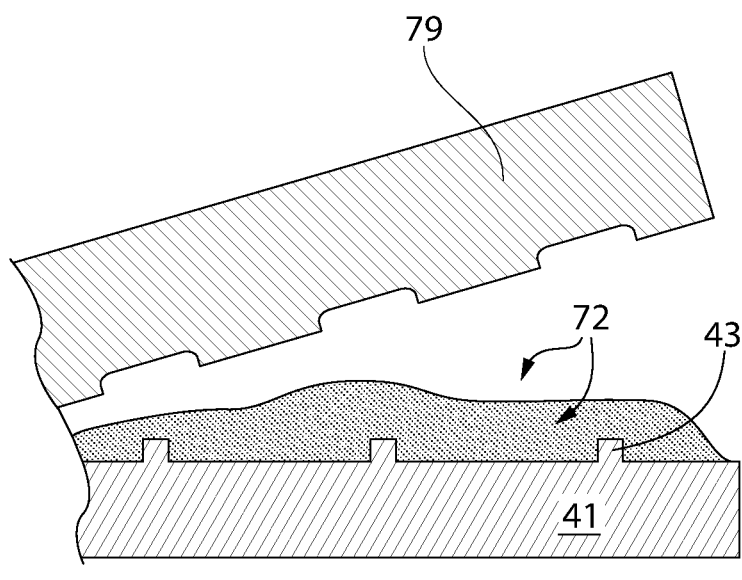
FIG. 7C is a cross-sectional side view of the Cr-coated quartz tool after a controlled etch of the exposed quartz.
Figure 7D:
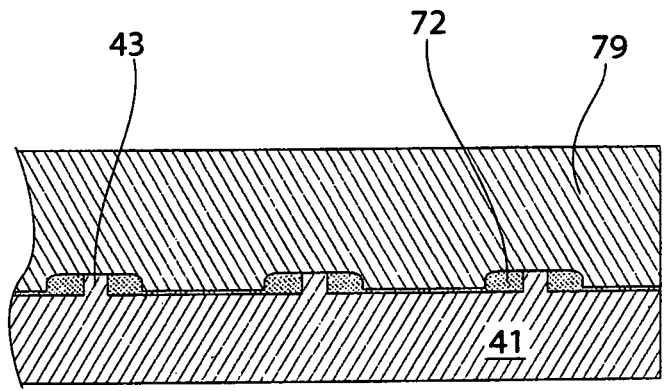
FIG. 7D is a cross-sectional side view of the quartz tool after the remaining chromium has been stripped off.
Figure 7E:
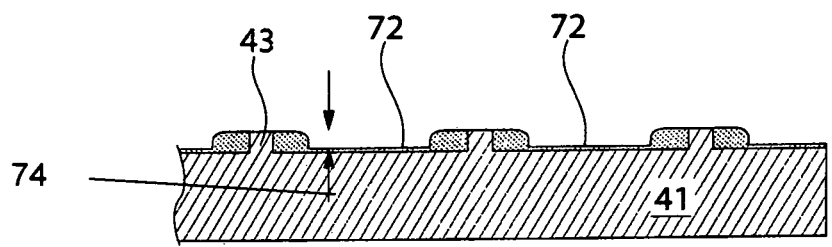
FIG. 7E is a cross-sectional side view showing excess polymer adhesive placed over the pinned surface of the e-chuck, and the quartz tool about to be pressed into the uncured polymer.
Figure 7F:
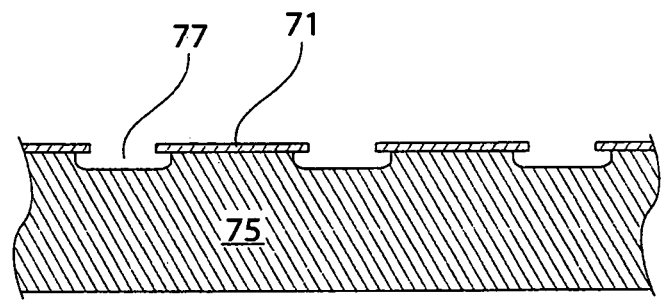
FIG. 7F is a cross-sectional side view showing the quartz tool being pressed into the uncured polymer, and so aligned such that depressions in the quartz tool correspond to pins on the e-chuck substrate.
Figure 7G:
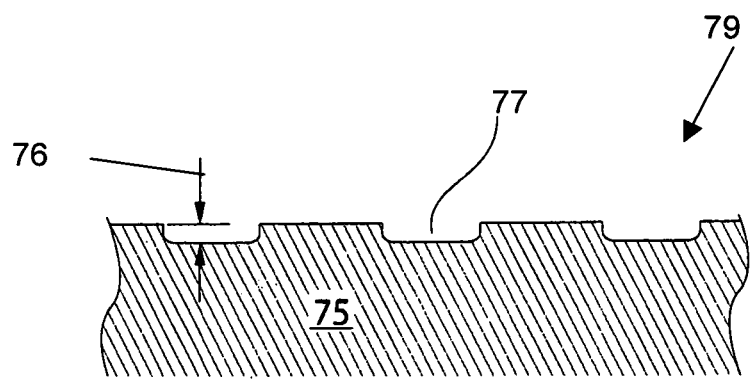
FIG. 7G is a cross-sectional side view of the pinned e-chuck substrate after removal of the quartz tool.

The metallized film extensions 37, 39 were connected to a high voltage power supply 51 to create the electrostatic attraction force on a Si wafer 53 placed on top of the pins of the pinned substrate 41. See FIG. 6. Several thousand volts were applied to the halves 33, 35 of the electrode film 31 via leads 55, 57 and alligator clips 52, 54. The Si wafer 53 could be suspended upside down without falling off.

Four such E-chucks were prepared, and measurements taken of the distance between the tops of the pins and the top surface of the dielectric film, to gauge how reproducible and uniform this distance is. This distance gap between the pin top and the upper surface of the dielectric ranged from 11 to 19 microns. Further, the pin height averaged about 140 microns from the valley or base of the E-chuck supporting surface. The elevation or stack height of the laminated electrode film was 127+/−8 microns.

The advantages of such an E-chuck over the current state of the art include:
  Ease of fabrication
  High die site flatness
  High thermal conductivity
  Flow-through capability for extreme temperature control
  Matching CTE to that of Si wafer

Pinned E-Chuck with Sandwich Film for Electrostatic Chucking—with Extremely Controlled Metallization to Wafer Distance In another aspect of the instant invention, the Applicant has developed a further sophistication for the concept described above. The current EDMing process can control the pin height reasonably well (e.g. ±10 μm). However, distance between the pin-tops and the valley area between the pins varies by over 10 microns. When the dielectric sandwich film layers are bonded on the pinned substrate, the gap, g, between the top of the dielectric film and Si wafer varies significantly. As a result, the chucking force, which is controlled by the following equation, varies from location to location. As a result, the wafer cannot be held sufficiently flat to achieve nm scale lithography.

The chucking force is given by $$F = \left(\frac{A}{2}\right)\varepsilon_0 \left[\frac{V*k}{D+k*g}\right]^2 \quad (1)$$

$\varepsilon_0$=absolute permittivity of vacuum
k=dielectric constant
A=area of conductor
V=applied voltage
D=thickness of the dielectric
g=gap between dielectric and substrate The Applicant's innovative solution to overcome this problem involves using a photolithographically produced master and a replication process to precisely control the distance between the pin top and the valley between pins. Here, the pin top is used as the reference surface instead of the valley between the pins. This process is shown schematically in FIGS. 7A through 7G.

The following Example 2 shows how to conduct this innovative replication.

Example 2

This Example demonstrates the application of the insulator layer such that the height or distance between the pin tops and the upper surface of the insulation layer is carefully controlled. It is made with reference to FIGS. 7A through 7G.

First, a quartz tool is fabricated. The tool is 300 mm in diameter and is lapped so that the contact or working surface (face) of the tool is optically flat (for example, 1/10 wavelength, or about 63 nm). This flat surface is then coated with chromium 71. A layer of photoresist is then applied on top of the chromium layer. A pattern of dots (or the reverse) is then projected onto the photoresist layer, with the pattern corresponding to the locations of pins on the e-chuck substrate. The unexposed photoresist can then be dissolved away, leaving exposed chromium. The exposed chromium in turn can be stripped away using an etchant, thereby exposing a circular area 73 of quartz 75. These exposed regions of quartz can then be etched using hydrofluoric acid (HF) to make depressions 77 in the quartz of very controlled depth. The remaining chromium layer is then stripped away, leaving a quartz tool 79 having periodic and spaced depressions of highly controlled depth 76. This surface is then coated with a release agent such as TEFLON spray (DuPont, Wilmington, Del.).

Fabrication of Insulation Layer

The surface of the pinned electrostatic chuck substrate 41 featuring the pins 43 is coated with an electrically insulating polymer 72 that can be cured with heat or ultraviolet light. Here, the polymer used was bisbenzocyclobutene (BCB) from Dow Chemical Company, Midland, Mich. The polymer is applied in an excess quantity, and such that it fills all of the valleys in between pins, with no air gaps or pockets. Then, the quartz tool 79 is positioned over the pinned surface of the electrostatic chuck with the depressions 77 lining up with the pins 43, and then carefully pressed down against the pins, squeezing out excess BCB polymer 72 out to the sides. After curing the polymer, the quartz tool is separated from the electrostatic chuck substrate, and any residual polymer on the pins tops is removed by lapping. The electrically insulating polymer now possesses a very precise elevation relative to the pin tops, as suggested by the dimensional arrows 74 in FIG. 7E.

Finalizing the Electrode Layer

The electrode assembly is finalized by bonding a perforated metallized polymer film, such as the perforated metallized UPILEX film described in Example 1, to the pinned surface of the electrostatic chuck substrate. Specifically, the film is positioned so that the perforations line up with the pins on the chuck substrate, and with the metal layer placed (sandwiched) between the BCB polymer insulating layer and the UPILEX polymer dielectric layer.

Alternatively, the metallization can be deposited through a shadow masks in between the pins; followed by deposition of the dielectric layer. As a further alternative, no dielectric or insulating layer is applied following metallization.

The advantages of this approach include the following:
  Film gap is set by uniformity of the etch which is better than 0.1 um
  Flatness of the film layer is determined by the quality of the tool
  A thin quartz tool will comply to the wafer table everywhere making a precise reference surface gap.
  As a result, E-chucking forces can be controlled extremely well.

An alternative approach to achieve the same effect is described in the following Example 3. Here, instead of etching the quartz plate as in Example 2, a layer of photoresist layer of controlled thickness is deposited and etched photolithographically to produce the master. Moreover, two quartz plate tools are fabricated, having 5-micron and 10-micron deep holes or depressions, respectively. The tool with the 10-micron deep depressions will be used to mold the insulating polymer layer of controlled height, and the tool with the 5-micron deep depressions will be used to mold the dielectric polymer layer of controlled height.

Example 3

A chrome-on-glass dot array is patterned onto the back side of an optically flat surface of each of two quartz plates using standard photolithography, leaving oversized (with respect to pin diameter) opaque dots that correspond to the pin locations.

SU-8 photoresist is spun coat to a thickness of 10 µm on the optically flat surface of one of the quartz plates, and spun coat to a thickness of 5 µm on the optically flat surface of the other quartz plate. The photoresist is then selectively exposed to radiation coining through the back side of the quartz plate so the dots are transferred to the resist, and developed, leaving SU-8 everywhere except for the areas where the pins will touch during molding. Thus, two master tools are created.

NORLAND 63 optical adhesive 81 (Norland Products, Inc., Cranbury, N.J.) is applied to the SiC chuck substrate 41 between the pins 43, and the 10 µm thick SU-8/glass master is used similar to its use in Example 2 to cast and UV cure the optical adhesive. This creates the polymer insulating layer, and levels the top or exposed surface of this layer relative to the pin tops.

The pins are developed/cleaned of uncured optical adhesive using isopropyl alcohol.

The entire surface of the chuck is then thin film metallized with aluminum 83, after which laser ablation is used to create the half-circular dipoles of the chuck, splitting the circuit, and thereby permitting different electrical potentials to be applied to the two poles of the dipole.

The dielectric layer 85 is then fabricated in substantially the same manner as was the insulating polymer layer (using the same NORLAND 63 optical adhesive), except that the second quartz tool is used (the one having 5-micron deep depressions in the SA-8 photoresist).

Figure 8:
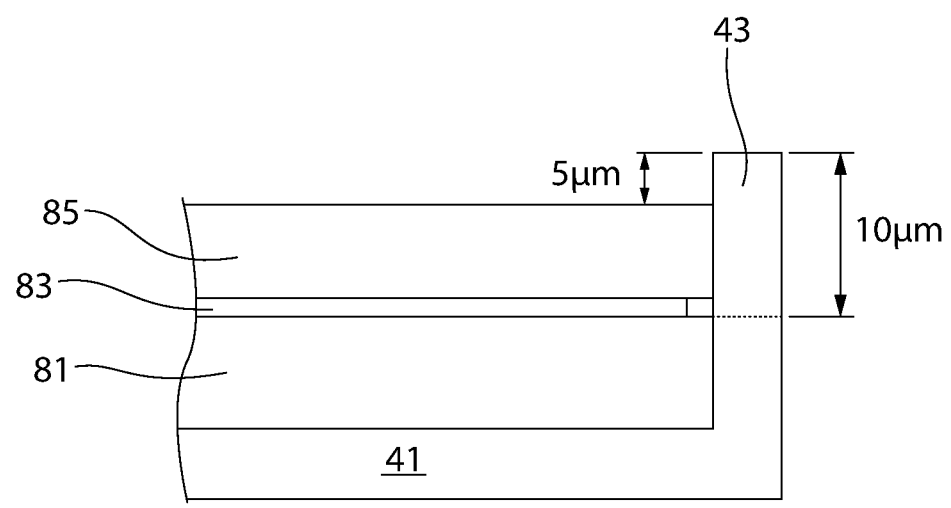
FIG. 8 is a cross-sectional side view similar to FIG. 5 but fabricated using the procedure of Example 2.

The pin tops are then chemically etched to remove the aluminum that is left exposed after the second molding processes (cleaning the pin tops as well). FIG. 8 shows a schematic of the resultant E-chuck.

A first alternative to Example 3 would be to pattern the chromium dots onto the same surface as that to which the SA-8 photoresist is applied instead of the opposite surface. If the thickness of the chromium layer is small (under a micron or two), it will not significantly alter the depth of the depressions in the tool. A second alternative to Example 3 would be to pattern the photoresist layer from the front, rather than through the quartz substrate from behind. Thus, the photoresist layer does not have to be applied to a transparent substrate such as quartz or glass, but can be deposited onto an opaque, but rigid, substrate such as silicon carbide. Further, the application of a chromium layer can be dispensed with.

INDUSTRIAL APPLICABILITY

The instant electrostatic chuck design will find utility among other reasons, because the electrode unit or assembly is located beneath the level of the tops of the pins of the chuck substrate, thereby ensuring minimal contact of the chuck with the article being process, e.g., a semiconductor wafer. At the same time, the electrode unit is readily accessible, and can easily be removed for repair or replacement as necessary. Further, the distance between the tops of the pins and the metallization layer and/or dielectric layer can be carefully controlled, for example, to vary by not more than 3 microns, thereby providing for a uniform electrostatic chucking force.

Applications of this electrostatic chuck and its method of manufacture include:
Semiconductor and liquid crystal display manufacture
Etching
Lithography
Physical vapor deposition
Chemical vapor deposition
Test and Measurement An artisan of ordinary skill will appreciate that various modifications may be made to the invention herein described without departing from the scope or spirit of the invention as defined in the appended claims.

What is claimed is:

1. An electrostatic chuck, comprising:
   (a) a substrate;
   (b) said substrate having a plurality of pins arranged thereon for supporting a body with a minimum of contact, wherein said pins comprise at least one side surface and a top surface, and further wherein said top surfaces of said pins are at a common elevation that is maintained within 10 nm over an area 10 mm square;
   (c) a multilayer film stack including a metal film laminated or sandwiched between two layers of electrically insulating material, and bonded to each, said layers of said multilayer film stack being commercially available; and
   (d) said film stack further including a plurality of perforations sized and positioned to correspond to positions of said pins such that said multilayer film stack can be attached to said base with said pins protruding completely through said perforations, and with a distance between said top surface of said pins and a top surface of the metal film not varying by more than 3 microns.

2. A tool for forming a polymer layer of controlled thickness, comprising:
   (a) a rigid substrate plate featuring
       (i) a face or reference surface having a flatness deviation that is less than 1 micron;
       (ii) a coating of photoresist material contacting and bonding to said reference surface, said coating having a thickness of at least about 5 microns, and being uniform in thickness to within 3 microns; and
   (b) a plurality of regions in said coating where photoresist material has been removed, thereby creating a depression at each of said regions, said plurality of regions being in a geometric pattern, and each of said regions being at least 100 microns in diameter.

3. A process used in making an electrostatic chuck, comprising:
   (a) providing said tool of claim 2 and a pinned wafer chuck substrate having a support surface featuring a plurality of pins of uniform height;
   (b) engineering an elevation of the pins of said pinned wafer chuck substrate to be within 1 micron;
   (c) applying an electrically insulating polymer material in uncured form to said pinned surface in an excess quantity;

(d) positioning said tool over the chuck substrate such that when said tool is contacted to said pinned wafer chuck substrate, the tops of the pins will contact a bottom of each depression in the tool without the sides of the pins contacting the plate;

(e) pressing said tool against the pinned surface and uncured polymer until said pins contact the depressions in said tool, thereby squeezing out excess uncured polymer;

(f) curing said electrically insulating polymer material; and (g) removing said tool.

4. The method of claim 3, wherein the contacting surface of said tool features a release agent coated thereon.

5. The method of claim 3, further comprising removing cured polymer material from the tops of pins of said chuck substrate.

6. The method of claim 3, further comprising depositing a metallization layer onto said pinned surface following removal of said tool.

7. The method of claim 6, further comprising depositing a dielectric layer onto said metallization layer.

8. The method of claim 3, further comprising (h) providing a metallized dielectric film comprising perforations corresponding to locations of pins on said chuck substrate (i) positioning said metallized dielectric film over said pinned substrate with the pins aligned with the perforations in the film and with the metal of the metallized layer located between the dielectric layer and the electrically insulating layer; and (j) bonding said metallized dielectric film to said electrically insulating layer.

9. The method claim 8, wherein said bonding occurs after said polymer of said electrically insulating layer has cured.

10. The method claim 8, wherein said positioning of said metallized dielectric film occurs before said polymer of said electrically insulating layer has cured, and before said tool is pressed against the pinned surface and uncured polymer.

11. The tool of claim 2, wherein said geometric pattern is a triangular pattern.

12. The tool of claim 2, wherein said plurality of regions are spaced 5 mm apart.

13. The tool of claim 2, wherein said rigid substrate comprises SiC.

14. The tool of claim 2, further comprising a pinned chuck substrate, and wherein said regions are positioned to correspond to positions of pins on said pinned chuck substrate, and each region having a diameter sufficient such that said tool can be positioned over the chuck with the tops of the pins contacting a bottom of said regions without the sides of the pins contacting the tool.

15. The electrostatic chuck of claim 1, wherein said substrate comprises Si/SiC.

16. The electrostatic chuck of claim 1, wherein said substrate comprises flow-through cooling channels.

17. The electrostatic chuck of claim 1, wherein said layer of electrically insulating material that is bonded to said base comprises a polymer that was cured with heat or ultraviolet light.

18. The electrostatic chuck of claim 17, wherein said polymer comprises bisbenzocyclobutene.

* * * * *